United States Patent
Varnica et al.

(10) Patent No.: US 10,158,378 B1
(45) Date of Patent: *Dec. 18, 2018

(54) SYSTEMS AND METHODS FOR ON-DEMAND EXCHANGE OF EXTRINSIC INFORMATION IN ITERATIVE DECODERS

(71) Applicant: MARVELL INTERNATIONAL LTD., Hamilton (BM)

(72) Inventors: Nedeljko Varnica, San Jose, CA (US); Panu Chaichanavong, Bangkok (TH)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 15/288,128

(22) Filed: Oct. 7, 2016

Related U.S. Application Data

(63) Continuation of application No. 14/228,597, filed on Mar. 28, 2014, now Pat. No. 9,467,171.

(60) Provisional application No. 61/809,738, filed on Apr. 8, 2013.

(51) Int. Cl.
| | |
|---|---|
| *H03M 13/00* | (2006.01) |
| *H03M 13/09* | (2006.01) |
| *G06F 11/10* | (2006.01) |
| *H03M 13/11* | (2006.01) |
| *H03M 13/25* | (2006.01) |
| *H04L 1/00* | (2006.01) |

(52) U.S. Cl.
CPC ..... *H03M 13/1128* (2013.01); *H03M 13/255* (2013.01); *H04L 1/0057* (2013.01)

(58) Field of Classification Search
None
See application file for complete search history.

(56) References Cited

U.S. PATENT DOCUMENTS

| | | | |
|---|---|---|---|
| 6,119,260 | A | 9/2000 | Tomisawa et al. |
| 7,793,196 | B2 | 9/2010 | Jiang et al. |
| 8,117,515 | B2 | 2/2012 | Yang |
| 8,176,400 | B2 | 5/2012 | Tan et al. |
| 8,291,285 | B1 | 10/2012 | Varnica et al. |
| 8,307,268 | B2 | 11/2012 | Chaichanavong et al. |
| 8,499,228 | B2 | 7/2013 | Heinrich et al. |
| 8,930,792 | B2 | 1/2015 | Li et al. |
| 2006/0195765 | A1 | 8/2006 | Coffey |
| 2012/0166742 | A1 | 6/2012 | Wang et al. |
| 2012/0278530 | A1 | 11/2012 | Ebsen |
| 2012/0317322 | A1 | 12/2012 | Chirca et al. |
| 2013/0132806 | A1 | 5/2013 | Vummintala et al. |
| 2013/0336430 | A1 | 12/2013 | Au Yeung et al. |

*Primary Examiner* — Justin R Knapp

(57) ABSTRACT

Systems and methods are provided for decoding a codeword using an iterative decoding process. The systems and methods include receiving a codeword comprising a plurality of symbols, and concurrently processing the received codeword with a detector and a decoder based in part on extrinsic information associated with the plurality of symbols to obtain updated extrinsic information. The systems and methods further include modifying the extrinsic information associated with the plurality of symbols based on the updated extrinsic information, and repeating the processing and modifying steps until a stopping criterion is met.

20 Claims, 11 Drawing Sheets

SYSTEMS AND METHODS FOR ON-DEMAND EXCHANGE OF EXTRINSIC INFORMATION IN ITERATIVE DECODERS

CROSS REFERENCE TO RELATED APPLICATION

This application is a continuation of U.S. patent application Ser. No. 14/228,597, filed Mar. 28, 2014 (allowed) which claims the benefit under 35 U.S.C. § 119(e) of U.S. Provisional Application No. 61/809,738, filed on Apr. 8, 2013, both of which are incorporated herein by reference in their respective entireties.

FIELD OF USE

The present disclosure relates generally to error correcting systems and methods and, more particularly, to iterative decoders that exchange on-demand messages containing extrinsic information between a channel detector and a decoder. Using the on-demand messages, the channel detector and the decoder may process the same codeword concurrently.

BACKGROUND OF THE DISCLOSURE

Iterative decoders are widely used to recover and correct information in communications and storage systems. When used to decode a codeword sent over or written on a channel with memory, iterative decoders typically consist of two processing blocks: a channel detector and a decoder. The channel detector and the decoder process a received codeword sequentially for multiple iterations. However, so far, iterative decoders have lacked the ability to process a given received codeword concurrently with both a channel detector and a decoder.

SUMMARY

In accordance with an embodiment of the present disclosure, a method is provided for decoding a codeword using an iterative decoding process. A codeword, which includes a plurality of symbols, is received and concurrently processed with a detector and a decoder based in part on extrinsic information associated with the plurality of symbols to obtain updated extrinsic information. The extrinsic information associated with the plurality of symbols is modified based on the updated extrinsic information. The processing and modifying steps are repeated until a stopping criterion is met.

In some implementations, the detector is a channel detector and the decoder is an error correction control (ECC) decoder.

In some implementations, the processing performed by the detector is based on a soft-output Viterbi algorithm and the decoder is based on a low-density parity check (LDPC) decoding algorithm.

In some implementations, the extrinsic information is stored in a common memory location that is accessed on-demand by the detector and decoder.

In some implementations, the processing performed by at least one of the detector and the decoder differs between a first iteration and a second iteration.

In some implementations, modifying the extrinsic information includes scaling the updated extrinsic information.

In accordance with another embodiment of the present disclosure, a system is provided for decoding a codeword. The system includes control circuitry configured to receive a codeword, wherein the codeword includes a plurality of symbols. The system further includes a detector and a decoder, wherein the detector and the decoder are configured to concurrently process the received codeword based in part on extrinsic information associated with the plurality of symbols to obtain updated extrinsic information. The detector and the decoder are further configured to modify the extrinsic information associated with the plurality of symbols based on the updated extrinsic information and to repeat the processing and the modifying steps until a stopping criterion is met.

In some implementations, the detector is a channel detector and the decoder is an ECC decoder.

In some implementations, the processing performed by the detector is based on a soft-output Viterbi algorithm and the decoder is based on an LDPC decoding algorithm.

In some implementations, the extrinsic information is stored in a common memory that is accessed on-demand by the detector and the decoder.

In some implementations, the processing performed by at least one of the detector and the decoder differs between a first iteration and a second iteration.

In some implementations, modifying the extrinsic information includes scaling the updated extrinsic information.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

Figure 1:
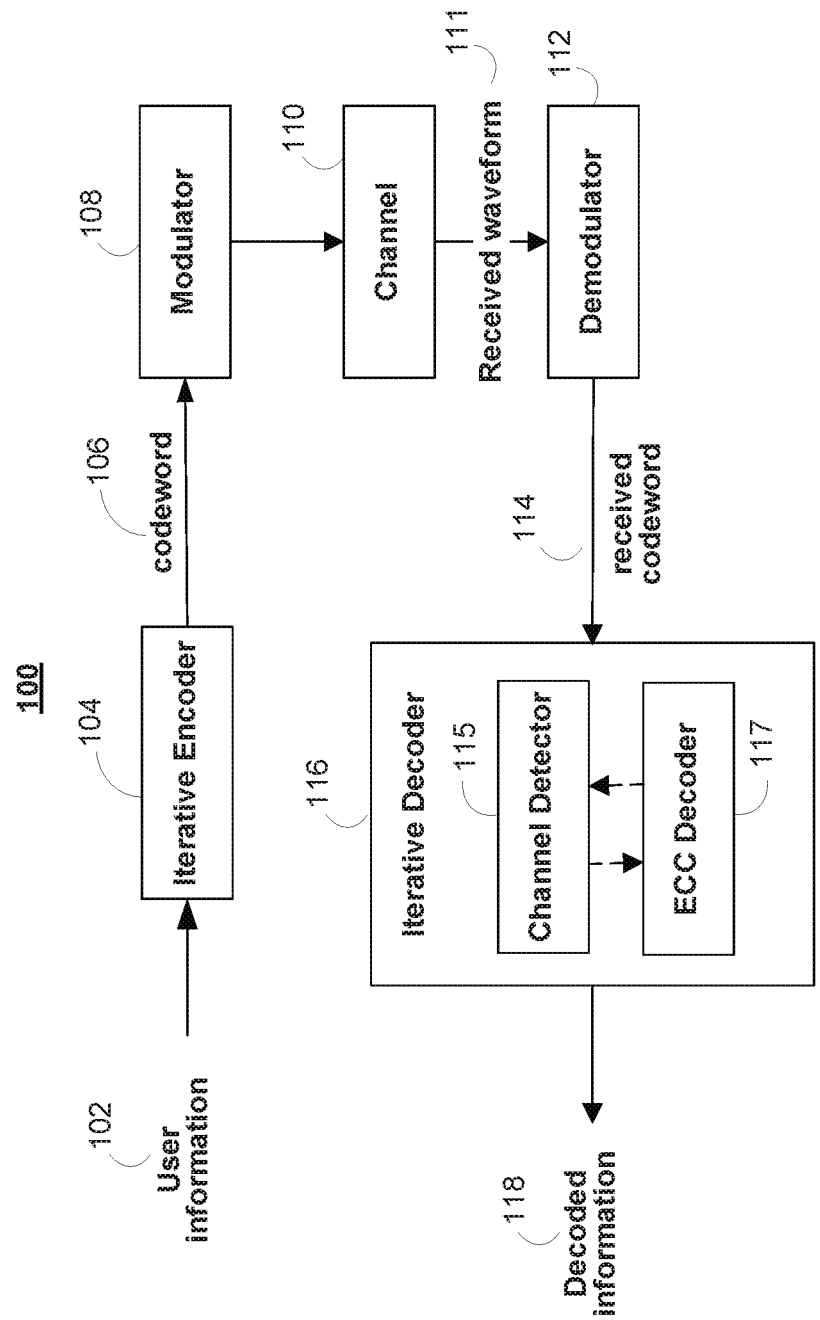
FIG. 1 shows an illustrative communication or data storage system that utilizes an iterative error detection and correction process for achieving reliable communication or storage, in accordance with an embodiment of the present disclosure.

Error correction codes, such as Low Density Parity Check (LDPC) codes, are widely used today in the transmission of information through noisy communications channels, with or without memory. They may likewise find application in storage systems where the retrieval of stored information is analogous to the transmission of information through a communication channel. A variety of decoding techniques may be used to recover and correct the information transmitted across the channel, many of which are iterative in nature.

In the case of a memoryless channel, an error correction code (ECC) decoder may directly receive log-likelihood-ratio (LLR) information, a bit reliability metric representative of the encoded data received from the channel, for use in the decoding operation. In the case of a channel with memory, a channel detector, such as a soft output Viterbi algorithm (SOVA) detector, may be used in conjunction with the ECC decoder. The decoding operation may alternate between processing the received codeword using the channel detector and the ECC decoder in order to decode the data. In particular, LLR information may be passed from the channel detector to the ECC decoder for use in the next decoding iteration and vice versa, in an iterative process that may be repeated, as desired, in order to improve decoding reliability.

LDPC codes are a specific type of error correction code that is frequently employed in practice. LDPC codes may be represented by many different types of parity check matrices. The structure of an LDPC code's parity check matric may be, for example, random-cyclic, or quasi-cyclic. LDPC codes defined by quasi-cyclic parity check matrices are particularly common and computationally efficient. These codes are known as quasi-cyclic low density parity check (QC-LDPC) codes.

A SOVA detector is a specific type of channel detector that is frequently employed in practice. It differs from the classical Viterbi algorithm by using path metrics that account for a priori probabilities of the input symbols. Moreover, the SOVA algorithm produces a "soft output" (e.g., LLR information), which indicates the reliability of the channel detector output. The use of soft information by both channel detector and ECC decoder enables the exchange of soft information between a SOVA-based channel detector and an LDPC-based ECC decoder in an iterative decoding process, for example.

A parity check matrix representative of a particular LDPC code may correspond to a bi-partite graph with check nodes and variable nodes. An LDPC decoder may decode received codewords using an iterative message-passing algorithm, in which each iteration or sub-iteration includes two update steps involving the variable nodes and check nodes. As used herein, the term "message" refers to a numerical value, usually representing an LLR. In the first update step, messages may be passed from some (or all) check nodes to some (or all) variable nodes, and in the second update step, messages may be passed from some (or all) variable nodes to some (or all) check nodes.

Iterative decoders that comprise a channel detector and an ECC decoder generally process different codewords at the same time in order to simplify the exchange of soft information between the channel detector and the ECC decoder. For example, in a first time slot the channel detector may process a first codeword while the ECC decoder processes a second codeword. Upon completion of the processing, soft information for both codewords is exchanged between channel detector and ECC decoder and each of the channel detector and the ECC decoder may process the other codeword. Despite its conceptual simplicity, such time-staggered operation may be disadvantageous from a performance perspective because concurrent processing of the same codeword by channel detector and ECC decoder has the potential to speed up convergence and reduce the delay associated with processing a received codeword.

Systems and methods are provided for concurrently processing a codeword by a channel detector and an ECC decoder in an iterative decoder. The channel detector and the ECC decoder exchange messages comprising extrinsic information, such as log-likelihood ratios (LLRs).

As used herein, "information" and "data" refer to any unit or aggregate of energy, signals, or values that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

FIG. 1 shows an illustrative communication or data storage system 100 that utilizes error correcting codes, such as LDPC codes, for achieving reliable communication or storage, in accordance with some embodiments. User information 102 is encoded through iterative encoder 104. User information 102, may be referred to as the message information or a message vector, may be grouped into units of k symbols. Each symbol may be viewed as an element of a Galois Field (GF) with a certain order. For example, a Galois Field with order two may correspond to binary symbols. The result of encoding user information 102 is codeword 106. Codeword 106 may be of a predetermined length.

In some embodiments, codeword 106 is passed to a modulator 108. Modulator 108 prepares codeword 106 for transmission across channel 110. Modulator 108 may use phase-shift keying, frequency-shift keying, quadrature amplitude modulation, or any suitable modulation technique to modulate codeword 106 into one or more information carrying signals. Channel 110 may represent media through which the information carrying signals travel. For example, channel 110 may represent a wired or wireless medium in a communication system, or a storage medium in which the information-carrying signals may be stored. The storage medium may be an electronic (e.g., RAM, ROM), magnetic (e.g., a hard disk), or optical (e.g., CD, DVD, or holographic) storage medium.

Due to interference from other signals or other types of noise and phenomena, channel 110 may corrupt the waveform transmitted by modulator 108. Thus, the waveform received by demodulator 112, i.e., received waveform 111, may be different from the originally-transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received codeword 114, which may contain errors due to channel corruption.

Received codeword 114 may then be processed by iterative decoder 116. Iterative decoder 116 may be used to correct or detect errors in received codeword 114. In some embodiments, iterative decoder 116 may include a channel detector 115 and an ECC decoder 117. Channel detector 115 may be implemented using a Soft-Output Viterbi Algorithm (SOVA) detector. Iterative decoder 116 may use an iterative message passing algorithm to correct or detect errors in received codeword 114 in order to output decoded information 118.

A channel iteration refers to an iteration between a channel detector and an ECC decoder (e.g., an LDPC decoder). For example, a channel iteration may refer to repeated instances of information passing between channel detector 115 and ECC decoder 117. In contrast, an ECC iteration may refer to iterations within the ECC decoder (e.g., a flooding decoder or layered decoder), for example, repetition of calculations within ECC decoder 117. The ECC decoder generally processes symbols of received codeword 114 multiple times within a channel iteration. For example, the ECC decoder may process all symbols of the codeword five or more times within a channel iteration. In contrast, the channel detector may typically process each symbol of received codeword 114 only once during a channel iteration.

Figure 2:
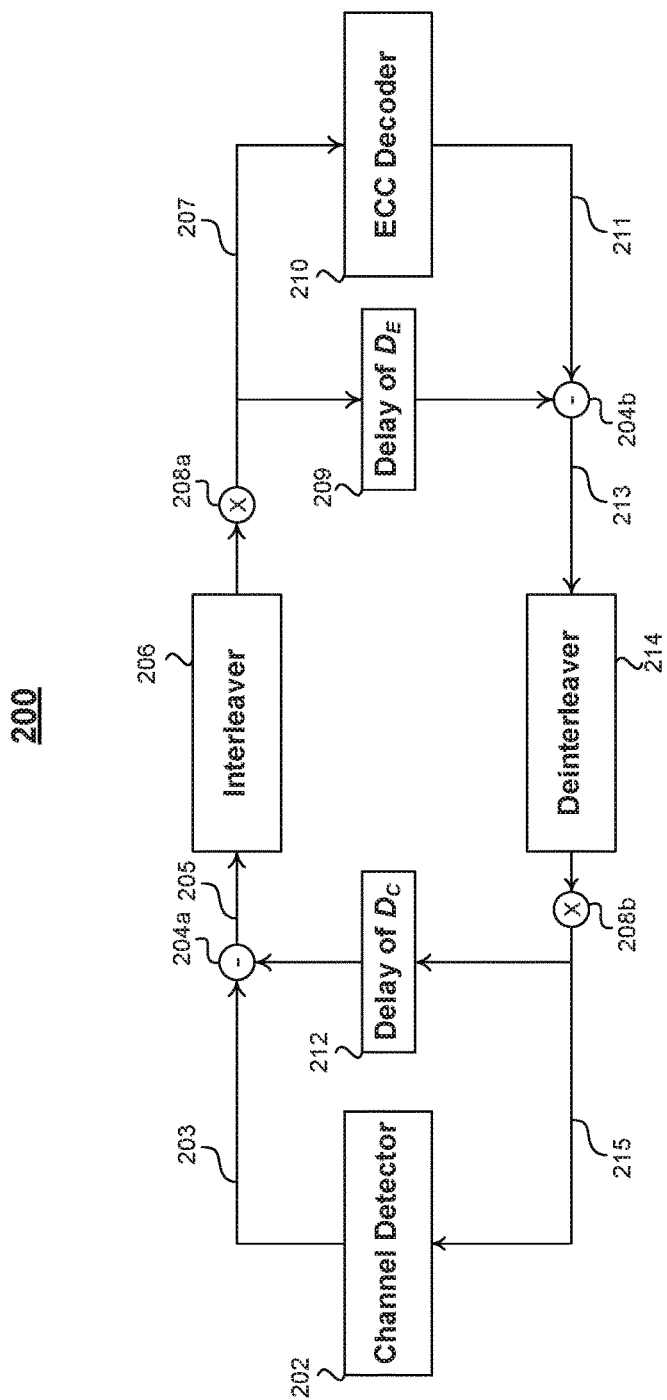
FIG. 2 shows an illustrative block diagram of an iterative decoder comprising a channel detector and an ECC decoder, in accordance with an embodiment of the present disclosure.

FIG. 2 shows a block diagram of an iterative decoder 200 comprising a channel detector and an ECC decoder, in accordance with an embodiment of the present disclosure. Iterative decoder 200 may be a more detailed representation of iterative decoder 116 of FIG. 1 and may include a channel detector 202 and an ECC decoder 210. As is described in relation to FIG. 1, channel detector 202 and ECC decoder 210 may concurrently process received codeword 114 in multiple iterations. Channel detector 202 and ECC decoder 210 may exchange extrinsic information with one another in order to improve decoding performance between iterations.

In some embodiments, extrinsic information of channel detector 202 may be defined as the additional information provided by the processing of channel detector 202 relative to the information provided as input. Channel detector 202 may process the codeword based on a vector of a priori probabilities, wherein each element of the vector may correspond to a specific symbol of the codeword. This a priori information 215 may be expressed in the form of LLRs, i.e., each symbol in the codeword vector may correspond to a specific LLR value. The processing performed by detector 202 results in updated LLR values, which are also referred to as a posteriori information. Similar to the a priori information, a posteriori information 203 may be expressed in the form of log-likelihood ratios. Similar to the channel detector 202, the ECC decoder 207 takes a priori information 207 as input to obtain a posteriori information 211 as output.

Iterative decoder 200 may comprise subtractors 204a and 204b (generally subtractor 204) to convert a posteriori information 203 and 211 into extrinsic information 205 and 213, respectively. Specifically, in some embodiments, extrinsic information 205 is obtained by subtracting a delayed version of channel detector a priori information 215 from channel detector a posteriori information 203. The delay may account for the delay associated with the processing of channel detector 202. The subtraction of the channel detector's a priori information from its a posteriori information thus accounts for the information that was known about the received codeword prior to processing it with the channel detector. In other words, extrinsic information 205 may correspond to the additional degree of certainty provided by the processing of channel detector 202 given some a priori information.

In some embodiments, extrinsic information 213 corresponding to ECC decoder 210 may be obtained by subtracting a delayed version of ECC decoder a priori information 207 from ECC decoder a posteriori information 211. The delay may correspond to the processing time associated with ECC decoder 210, which may be different from the processing time required by channel detector 202.

In some embodiments, iterative decoder 200 comprises an interleaver 206 and a deinterleaver 214 to convert the extrinsic information from a domain of the channel detector 202 to a domain of the ECC decoder 210.

It is important to note that the channel detector's a priori information 215 may readily be obtained from the ECC decoder's extrinsic information 213. Likewise, the ECC decoder's a priori information 207 may readily be obtained from the channel detector's extrinsic information 205. The correspondence is defined by interleaver 206 and deinterleaver 214. Typically, the parameters of the interleaver are known, and thus the extrinsic information and a priori information may be converted in a straightforward fashion.

In some embodiments, iterative decoder 200 may include scalers 208a and 208b (generally, scaler 208). Scaler 208a may scale extrinsic information 205 of channel detector 202, after processing by interleaver 206, by a fixed scaling factor. Similarly, extrinsic information 213 of ECC decoder 210, after deinterleaving, may be scaled by another fixed scaling factor by scaler 208b. Scalers 208 may improve performance when the extrinsic information is quantized to a finite number of values (e.g., a predefined number of quantization steps). For example, in some embodiments, the value of the extrinsic information associated with a given symbol of the codeword may be any one of 16 values. The quantization steps used to represent the extrinsic information using these 16 values may differ between the channel detector and the ECC decoder. Therefore, it may be beneficial to scale the extrinsic information such that the range of the extrinsic information after scaling covers the same value range as the associated quantization scheme.

Figure 3:
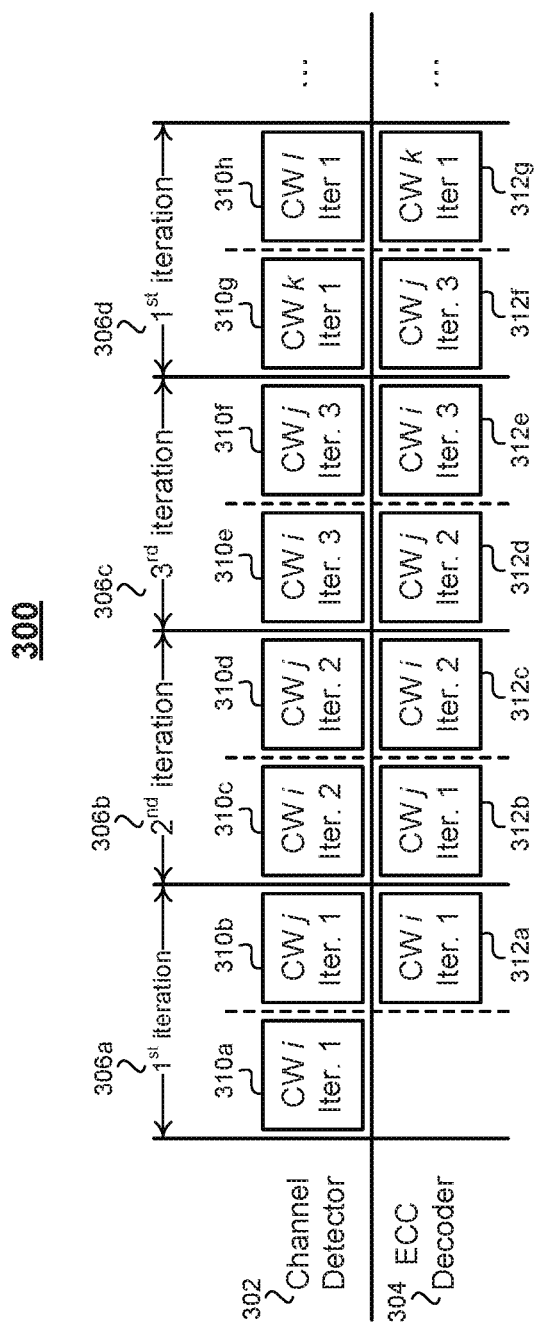
FIG. 3 shows an illustrative processing timeline of an iterative decoder in which a channel detector and an ECC decoder concurrently process different codewords, in accordance with an embodiment of the present disclosure.

FIG. 3 shows an illustrative processing timeline 300 that may be employed by iterative decoder 200 to process received codeword 114 in accordance with some embodiments. As described in FIG. 1, received codeword 114 may be processed by iterative decoder 116. Iterative decoder 116 may include a channel detector 115 and an ECC decoder 117. Each channel iteration 306a-d (generally, channel iteration 306) iterates between a channel detector 302, such as channel detector 115 of FIG. 1, and an ECC decoder 304, such as ECC decoder 117 of FIG. 1. These iterations are represented in FIG. 3 by channel detector processing blocks 310a-310h (generally channel detector processing block 310), which correspond to periods of time during which the channel detector is processing information. Similarly, ECC decoder processing blocks 312a-312g (generally, ECC decoder processing block 312) represent periods of time when the ECC decoder is processing information.

Each channel detector processing block 310 and ECC decoder processing block 312 is associated with a codeword index and an iteration index. The codeword index indicates which codeword is being processed by channel detector block 310 or ECC decoder block 312, respectively. The iteration index represents the channel iteration currently being processed by channel detector processing block 310 or ECC decoder processing block 312.

In one typical implementation illustrated in FIG. 3, channel detector 302 and ECC decoder 304 may not be able to concurrently process symbols of the same codeword. For example, as illustrated in FIG. 3, during the time period associated with channel detector processing block 310b, channel detector processing block 310b performs processing of codeword j in iteration 1 while ECC decoder processing block 312a performs processing of codeword i in iteration 1. Similarly, during the time period associated with the processing of channel detector processing block 310c, channel detector processing block 310c performs processing of codeword i in iteration 2 while ECC decoder processing block 312b performs processing of codeword j in iteration 1. Similar observations may be made for processing blocks 310d/312c, 310e/312d, etc.

Between adjacent processing blocks, extrinsic information may be exchanged between channel detector 302 and ECC decoder 304. The exchange of extrinsic information helps to improve decoding performance because it enables both channel detector and ECC decoder to use an improved set of a priori information for their respective processing.

According to processing timeline 300, channel detector 302 and ECC decoder 304 do not concurrently process the same codeword but alternate processing between two codewords, such as codeword i and codeword j during iterations 306a-306c in FIG. 3. In some approaches, this timing structure may be used to simplify the exchange of extrinsic information between channel detector 302 and ECC decoder 304. Specifically, extrinsic information for all symbols in a given codeword may be stored in a buffer upon completion of either a channel detector processing block 310 or an ECC decoder processing block 312. The subsequent processing block may then retrieve the stored information and perform its processing based on the retrieved information to obtain updated extrinsic information. Upon completion of that processing, the updated extrinsic information may again be stored in a buffer for use by another processing block in the next iteration.

Despite simplifying the exchange of extrinsic information, the above approach has the drawback that channel detector 302 and ECC decoder 304 cannot concurrently process the same codeword. The resulting need for buffering reduces the achievable peak decoding rate and the alternating processing may also affect the convergence speed of the iterative decoding process. In other words, a faster or more frequent exchange of extrinsic messages between the two processing blocks is desirable. Accordingly, there is a need for systems and methods that enable concurrent processing of a given codeword by both a channel detector and an ECC decoder.

Figure 4:
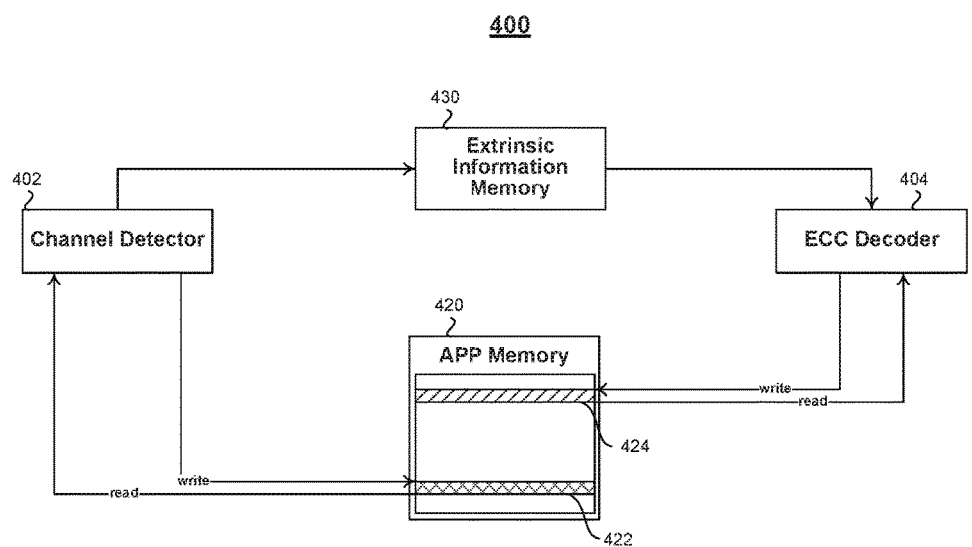
FIG. 4 shows an illustrative block diagram of an iterative decoder comprising a channel detector, an ECC decoder, and shared memory that is concurrently accessed by the channel detector and the ECC decoder, in accordance with an embodiment of the present disclosure.

FIG. 4 shows a block diagram of an iterative decoding system that supports concurrent processing of a given codeword by a channel detector and an ECC decoder, in accordance with some embodiments of the present disclosure. Iterative decoder 400 consists of a channel detector 402 and an ECC decoder 404, which are similar to channel detector 115 and ECC decoder 117 of FIG. 1, respectively. Iterative decoder 400 further includes an a posteriori probability (APP) memory 420 that stores a posteriori information associated with ECC decoder 404 and an extrinsic information memory 430 that stores extrinsic information associated with channel detector 402.

APP memory 420 and extrinsic information memory 430 are sufficient for computing the extrinsic information required for the processing at channel detector 402 and ECC decoder 404. Specifically, channel detector 402 may retrieve the APP information associated with the ECC decoder from APP memory 420 and subtract the corresponding extrinsic information from extrinsic information memory 430 to obtain the a priori information needed by the channel detector. The subtraction of the extrinsic information stored in memory 430 yields the desired result because the extrinsic information of the channel detector has a direct correspondence with the a priori information of the ECC decoder, aside from the interleaving performed by interleaver 206. This correspondence is illustrated in FIG. 2 with reference to channel detector extrinsic information 205, interleaver 206, and ECC decoder a priori information 207.

Upon completing its processing, the channel detector's a priori information may be subtracted from the channel detector's a posteriori information to obtain the channel detector's extrinsic information. The channel detector's extrinsic information may be stored in extrinsic information memory 430. At the same time, channel detector 402 may also store the channel detector's a posteriori information in APP memory 420.

In some embodiments, ECC decoder 404 may retrieve the ECC decoder's a priori information, which is the same as the channel detector's extrinsic information (aside from interleaving), from extrinsic information memory 430. Upon completing its processing, ECC decoder 404 may store its a posteriori information in APP memory 420. ECC decoder 404 may not need to store its extrinsic information at all, as the ECC decoder's a posteriori information is sufficient for the channel detector to derive the ECC decoder's extrinsic information by subtracting the channel detector's extrinsic information as described above, thus obtaining the channel detector's a priori information.

It is worthwhile to note that, in some embodiments, memory structures different from extrinsic information memory 430 and APP memory 420 may be employed to arrive at a substantially similar system. For example, in some embodiments, extrinsic information memory 430 may store the ECC decoder's extrinsic information rather than the channel detector's extrinsic information. The operation of such as system would be substantially similar except for interchanging the roles of channel detector 402 and ECC decoder 404.

In some embodiments, iterative decoder 400 enables channel detector 402 and ECC decoder 404 to concurrently process symbols corresponding to the same codeword by respectively retrieving updated extrinsic and/or a posteriori information from extrinsic information memory 430 and APP memory 420, performing the respective processing, and storing the updated extrinsic and/or a posteriori information in extrinsic information memory 430 and/or APP memory 420. In particular, channel detector 402 may retrieve symbols corresponding to memory location 422, while ECC decoder 404 processes symbols at memory location 424. The symbols located at memory locations 422 and 424 may be associated with the same codeword. Iterative decoder 400 therefore avoids the aforementioned disadvantages associated with not being able to concurrently process the same codeword with channel detector 402 and ECC decoder 404.

In some embodiments, depending on how the processing associated with channel detector 402 and ECC decoder 404 is scheduled, both channel detector 402 and ECC decoder 404 may attempt to concurrently access memory locations associated with the same symbols of the codeword. This may lead to memory conflicts because channel detector and ECC decoder may not be able to concurrently read and/or write at the same memory locations. Several design options may be considered to avoid such scheduling conflicts. For example, in one embodiment, the processing of channel detector 402 and ECC decoder 404 may be scheduled such as to avoid memory conflicts altogether. This may be ensured by proper design of the code and the interleaver 206. Additionally or alternatively, memory conflicts may be resolved through a protocol that ensures that whenever both blocks need to read and/or write to the same memory location, additional control circuitry ensures that the information at the memory locations is updated properly. Such conflict resolution protocols will further be discussed with reference to FIGS. 9A, 9B, and 9C.

Generally, interleaver 206 may be designed to maximize the performance of the system and to use computational resources of the hardware architecture as efficiently as possible. In some embodiments, interleaver 206 may be viewed as providing a mapping from the symbol domain of the channel detector to the symbol domain of the ECC decoder. Memory conflicts may be avoided by ensuring that despite concurrently processing the same codeword, channel detector and ECC decoder do not concurrently access the same symbols of the codeword.

In some embodiments of the present disclosure, extrinsic information, a priori information, and a posteriori information, may be represented by hard information (e.g., "0"s and "1"s) instead of soft information (e.g., LLRs). Although this option will not be described expressly in the remainder of the disclosure, the techniques discussed herein may readily be extended to encompass hard information.

Channel detector 202 may use various kinds of algorithms to perform channel detection, including but not limited to a soft-output Viterbi algorithm, the Bahl-Cocke-Jelinek-Raviv (BCJR) algorithm, and other suitable processing techniques.

Similarly, ECC detector 204 may use various kinds of algorithms to perform decoding, including but not limited to sum-product decoding techniques of LDPC or Turbo codes, or modifications of these algorithms such as min-sum decoders. The ECC decoder may also perform soft decoding of Reed-Solomon codes.

In some embodiments, the ECC decoder may iteratively process symbols of a given codeword multiple times, whereas channel detector 202 may process each symbol of the received codeword only once. For example, some types of ECC decoders may process each symbol of the codeword five or more times. With regard to the techniques and algorithms described in the present disclosure, this may be important to take into account, because ECC decoder 404 may need to access symbols many more times than channel detector 402. Therefore, in some embodiments, it may be beneficial to design the iterative decoder such that the memory access of the ECC decoder is optimized.

Iterative decoder 400 may be optimized such that channel detector 402 and ECC decoder 404 use the latest version of the extrinsic information that is currently available, for example by optimizing access to APP memory 420 and extrinsic information memory 430. However, in some embodiments, it may be desirable to design channel detector 402 and ECC decoder 404 such that they operate on delayed information (not shown in FIG. 4). For example, a codeword may be partitioned in a number of segments (e.g., five segments) and channel detector 402 and ECC decoder 404 may process these segments separately. After completing the processing of a segment of the codeword, channel detector 402 and ECC decoder 404 may exchange the extrinsic information associated with the processed segments. While such an implementation architecture not necessarily guarantees that the latest extrinsic information for a given symbol is available to channel detector 402 and ECC decoder 404 (due to the segmentation), this architecture may have benefits in terms of implementation complexity and hardware constraints.

Figure 5:
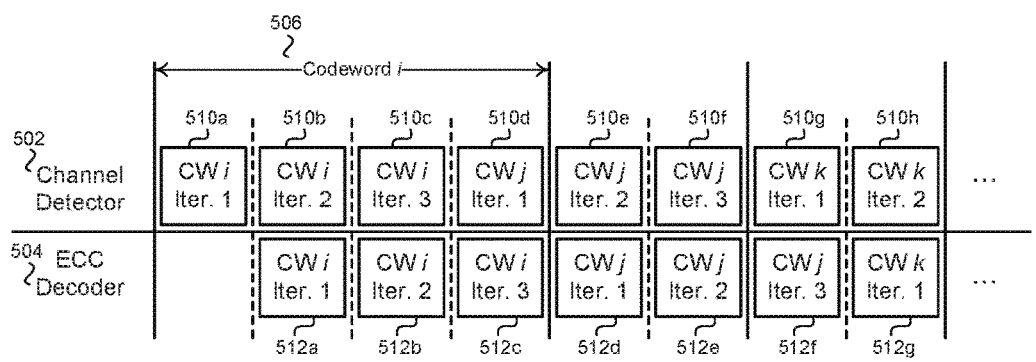
FIG. 5 shows an illustrative processing timeline of an iterative decoder in which a channel detector and an ECC decoder concurrently process the same codeword, in accordance with an embodiment of the present disclosure.

FIG. 5 shows an illustrative processing timeline 500 that may be employed by iterative decoder 200 to process received codeword 114 in accordance with some embodiments. As described in relation to FIG. 3, channel detector 502 and ECC decoder 504 may process the received codeword in multiple iterations. These iterations are represented in FIG. 5 by channel detector processing blocks 510a-510h (generally channel detector processing block 510), which correspond to periods of time during which the channel detector is processing information. Similarly, ECC decoder processing blocks 512a-512g (generally, ECC decoder processing blocks 512) represent periods of time during which the ECC decoder is processing information.

In the embodiment illustrated in FIG. 5, channel detector 502 and ECC decoder 504 may concurrently process symbols corresponding to the same codeword, for example by utilizing iterative decoding process 400. For example, during the time period associated with channel detector processing block 510b, channel detector 502 performs processing of codeword i in iteration 2 while ECC decoder 504 performs processing of codeword i in iteration 1.

In some embodiments, exchange of extrinsic information occurs both while channel detector 502 and ECC decoder 504 are processing data (i.e., during a processing block) as well as between processing blocks 510 and 512, respectively. For example, the memory structure of iterative decoder 400 may be used to facilitate this type of information exchange.

In some embodiments, there may be an offset between the iterations performed by channel detector 502 and ECC decoder 504. For example, as shown in FIG. 5, ECC decoder 504 may only start processing one processing block after the channel detector 502. The delayed processing may be due to a need for initializing the memory buffers at the beginning of processing a codeword. To avoid idling of ECC decoder 504 during such time periods, the ECC decoder may process a different codeword, such as the codeword that preceded the codeword about to be processed. It is worthwhile to note that a tradeoff may exist between processing the previous codeword (e.g., to improve decoding performance) vis-à-vis the additional power consumption that results from this processing. Thus, in some embodiments idling the ECC decoder may be preferable.

Figure 6:
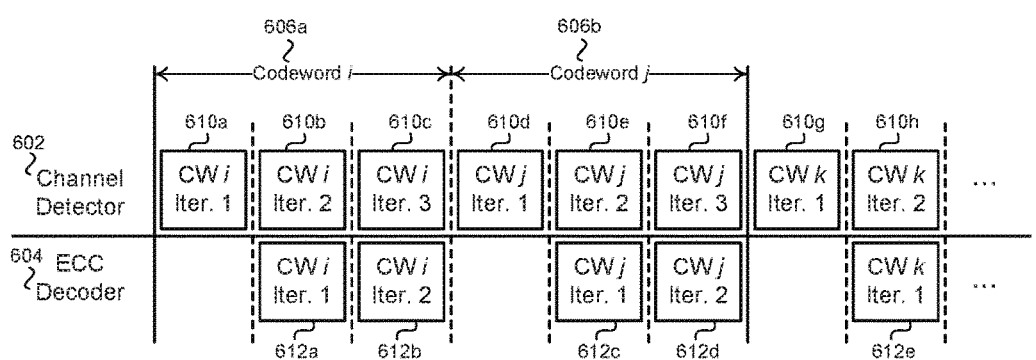
FIG. 6 shows an illustrative processing timeline of an iterative decoder in which a channel detector and an ECC decoder concurrently process the same codeword, in accordance with an embodiment of the present disclosure.

FIG. 6 shows an illustrative processing timeline 600 that may be employed by iterative decoder 400 to process received codeword 114 in accordance with some embodiments of the present disclosure. As described in relation to FIG. 3 and FIG. 5, each codeword may be processed in multiple iterations by channel detector 602 and ECC decoder 604. These iterations are represented in FIG. 6 by channel detector processing blocks 610a-610h (generally channel detector processing block 610), which correspond to periods of time during which the channel detector is processing information. Similarly, ECC decoder processing blocks 612a-612g (generally, ECC decoder processing blocks 612) represent periods of time during which the ECC decoder is processing information.

In some embodiments, the last ECC decoder processing block of a given codeword may be omitted. This may be beneficial from an implementation perspective because it avoids that more than one codeword needs to be concurrently processed by channel detector 602 and ECC decoder 604. Although the processing timeline discussed in relation to FIG. 5 also avoids concurrent processing of different codewords in most processing blocks, overlap may exist at codeword boundaries, such as for channel detector processing blocks 510d and ECC decoder processing block 512c.

The concurrent processing of different codewords by channel detector 502 and ECC decoder 504, even if limited to certain time instances, may require the implementation of additional memory to store the symbols corresponding to both codewords. Therefore, avoiding the concurrent processing of different codewords, as illustrated in FIG. 6, may reduce implementation complexity by avoiding the need for additional memory. Moreover, it may lead to reduced power consumption as ECC decoder 604 remains idle during the time period between processing blocks 612b and 612c. However, the complexity reduction and power savings may come at the cost of reduced decoding performance and throughput due to the idling of ECC decoder 604.

It should be noted that processing timelines 500 and 600, as shown in FIGS. 5 and 6 may be implemented in a similar fashion. Unless stated explicitly, the remainder of the present disclosure will focus on processing timeline 600. It is straightforward to extend these concepts to an implementation architecture that uses processing timeline 500.

In some embodiments, the processing performed by at least one of channel detector 502 and ECC decoder 504 may differ between iterations. In particular, channel detector 502 may use a first algorithm during a first iteration and a second algorithm during a second iteration. Even if the same algorithm is used across iterations, processing steps of the algorithm may be performed in a different order. For example, if channel detector 502 is based on a SOVA algorithm, channel detector 502 may process the codeword, in a first iteration, from a first end of the codeword to a second end of the codeword, opposite to the first end. In a second iteration, the SOVA algorithm may start at the second end of the codeword and terminate at the first end. Similarly, the processing performed by channel detector 502 and ECC decoder 504 may utilize different input parameters across iterations.

Figure 7:
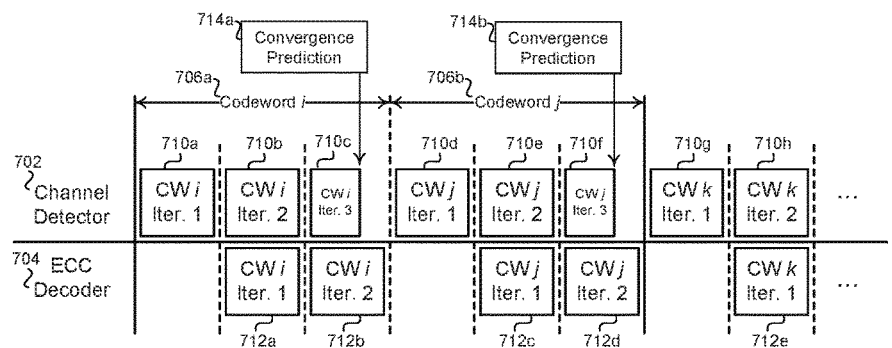
FIG. 7 shows an illustrative processing timeline of an iterative decoder comprising a channel detector and an ECC decoder, wherein the ECC decoder predicts when convergence is reached, in accordance with an embodiment of the present disclosure.

FIG. 7 shows a processing timeline 700 that enables the detection of convergence of the iterative decoding process, in accordance with some embodiments of the present disclosure. Similar to FIGS. 5 and 6, processing timeline 700 includes channel detector processing blocks 710a-h and ECC decoder processing blocks 712a-e. The iterative decoding process may enable ECC decoder 704 to predict convergence of the iterative decoding process in advance of convergence actually being reached. For example, as shown in FIG. 7, ECC decoder 704 may predict that convergence is reached after completing the second iteration of the ECC decoder, i.e., after completing ECC decoder processing block 712b. Convergence may be predicted some time in advance, such as at the end of channel detector processing block 710c. In one embodiment, with ECC decoder 704 decoding LDPC codes, the convergence prediction may be performed by verifying that the syndrome weight in the LDPC decoder is below a pre-determined threshold. The convergence prediction enables additional power savings because the processing associated with channel detector 702 can be stopped upon predicting that convergence of the ECC decoder will be reached. The idling of channel detector 702 during the remainder of the processing block leads to power savings.

Figure 8:
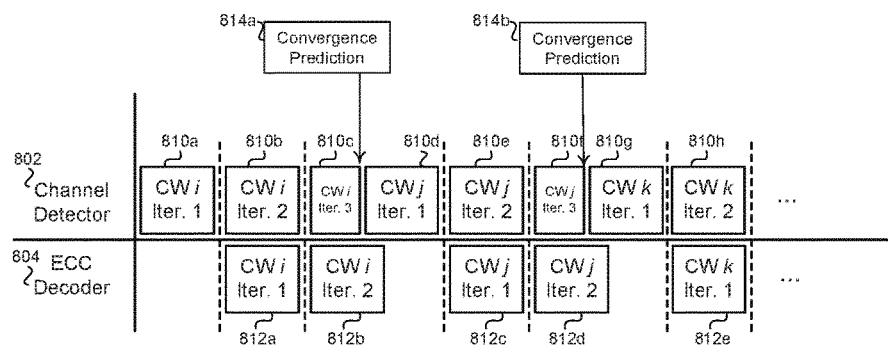
FIG. 8 shows an illustrative processing timeline of an iterative decoder comprising a channel detector and an ECC decoder, wherein the ECC decoder predicts when convergence is reached, in accordance with an embodiment of the present disclosure.

Alternatively, upon predicting convergence, channel detector 702 may immediately start the processing of a new codeword, as illustrated in processing timeline 800 in FIG. 8. This reduces the average amount of time required for processing a codeword because channel detector 802 may process a codeword j while the ECC decoder is completing the final decoding iteration associated with codeword i. Similar to the embodiment shown in FIG. 5, the concurrent processing of different codewords by channel detector 802 and ECC decoder 804 may require additional memory to store both the symbols of both codewords at the same time.

Although not shown in FIG. 7, convergence may be predicted after different numbers of iterations. For example, depending on the degree of noise, interference, or other corruption contained in the received codeword, the iterative decoding process may complete after two iterations for a first codeword but may take three of more iterations for a second codeword. Moreover, ECC decoder 704 may use different methods to predict performance, which may be particularly beneficial for LDCP codes, for example.

The convergence prediction discussed in relation to FIGS. 7 and 8 may be one form of a stopping criterion that defines when channel detector 702 and ECC decoder 704 may complete their respective processing of a given codeword. However, in some embodiments, other stopping criteria may be considered. For example, if the ECC decoder 702 is an LDPC decoder, the standard syndrome-check stopping criterion of LDPC decoders may be used. When the criterion is met, iterative decoder 400 may stop the processing of both channel detector 702 and ECC decoder 704.

In another example, channel detector 702 and ECC decoder 704 may simply process the received codeword for a predefined number of iterations. Although such a simple stopping criterion may not be optimal from a performance perspective, it may obviate the need for additional processing circuitry associated with the convergence prediction and thus save implementation complexity.

It is important to note that various forms of stopping criteria, as discussed in the preceding paragraph, may be used with any of the implementation architectures of the present disclosure. For example, in one embodiment, at least one of channel detector 702 and ECC decoder 704 may test whether a stopping criterion is satisfied (e.g., if an adequate level of convergence has been achieved). If the criterion is satisfied, channel detector 702 and ECC decoder 704 may complete their processing of the current codeword and start processing a next codeword. Conversely, if the stopping criterion is not satisfied, channel detector 702 and ECC decoder 704 may continue to process the current codeword in another iteration.

Figure 9A:
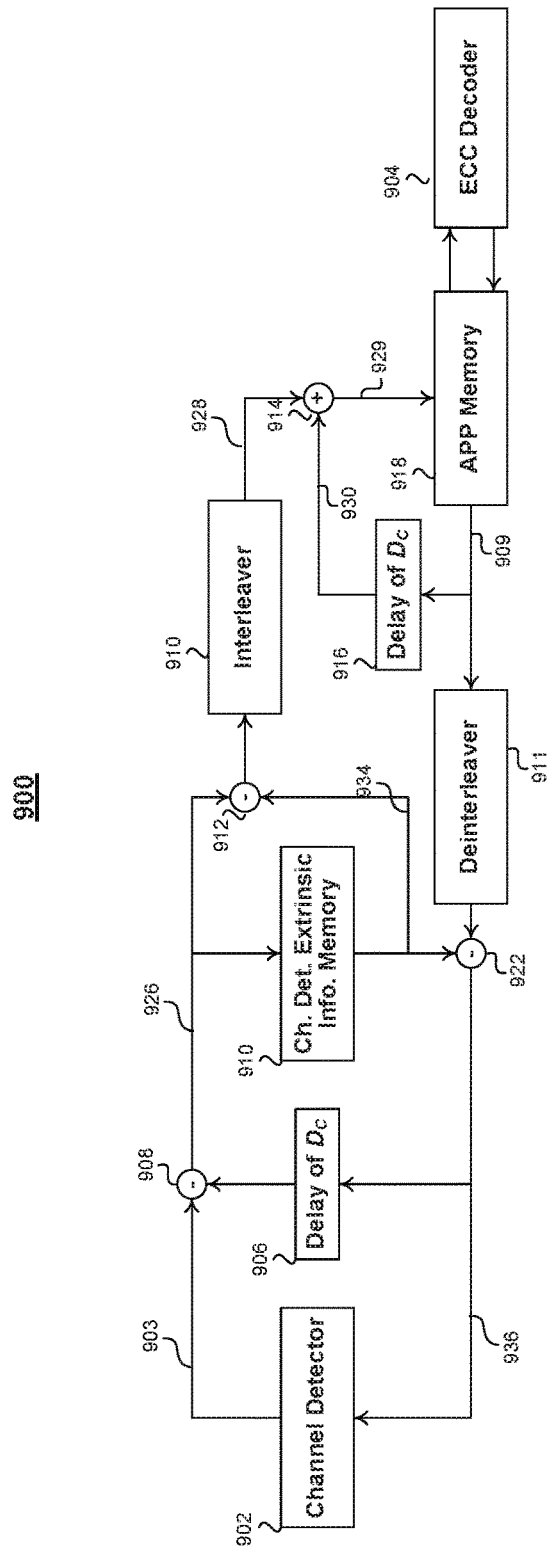
FIG. 9A shows an illustrative implementation architecture of an iterative decoder comprising a channel detector, an ECC decoder, and a three-port memory, in accordance with an embodiment of the present disclosure.
Figure 9B:
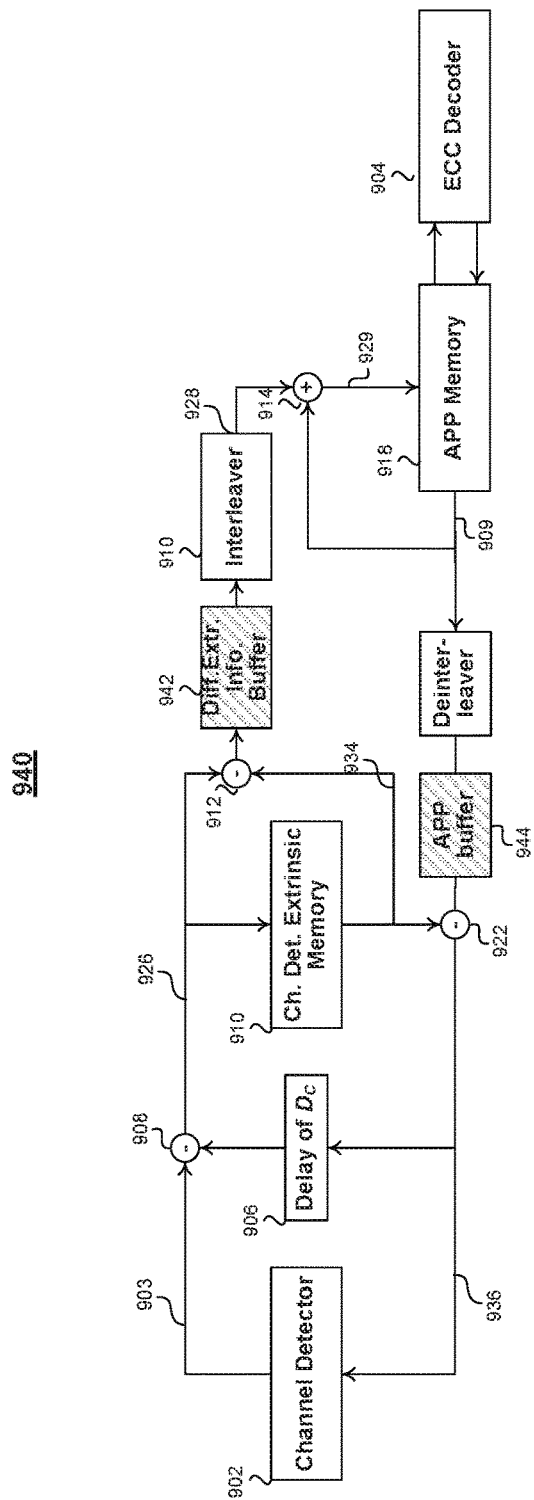
FIG. 9B shows an illustrative implementation architecture of an iterative decoder comprising a channel detector and an ECC decoder, wherein the ECC decoder is stalled when a maximum number of memory accesses in a given time instant is reached, in accordance with an embodiment of the present disclosure.
Figure 9C:
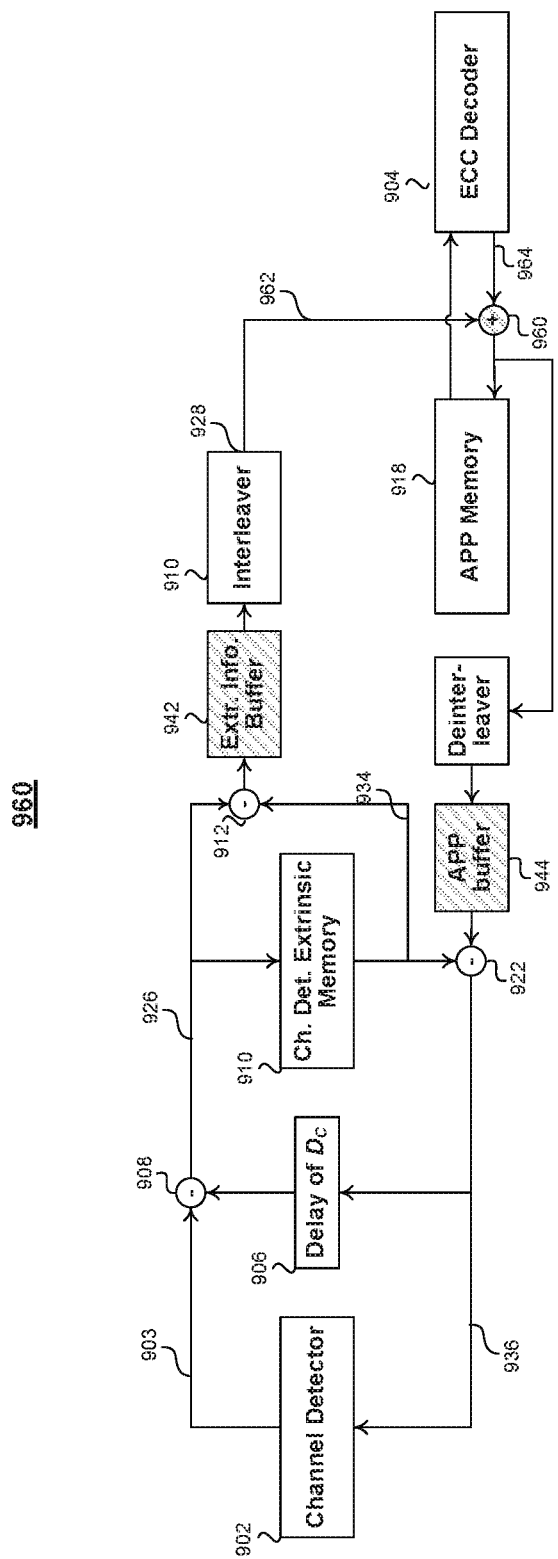
FIG. 9C shows an illustrative implementation architecture of an iterative decoder comprising a channel detector and an ECC decoder, wherein memory updates are synchronized with the ECC decoder's memory access, in accordance with an embodiment of the present disclosure.

FIGS. 9A, 9B, and 9C show examples of implementation architectures of iterative decoder 400, in accordance with some embodiments of the present disclosure. The three architectures illustrate different methods of minimizing the number of ports in decoder memories and avoiding memory conflicts that occur when channel detector and ECC decoder attempt to access the same memory location concurrently.

The number of ports of a memory may refer to the total number of read and/or write operations that can be performed concurrently in a given clock cycle. In some embodiments, the required number of ports in decoder memories may be a critical design consideration, because the size and cost of a memory generally increases with the number of its ports. In typical implementations of the iterative decoder timeline 300 shown in FIG. 3, channel detector 302 and ECC decoder 304 do not process the same codeword concurrently and require a larger number of memories to buffer different codewords, as explained earlier. Such implementations typically require two-port APP memories. On the other hand, in the iterative decoder embodiment in FIG. 4, concurrent processing of the same codeword by channel detector and ECC decoder is achieved, but a naïve implementation would require the APP memory to have four ports. It would be of significant benefit, if the number of required memory ports were reduced.

The three architectures, illustrated in FIGS. 9A, 9B, and 9C, are meant to illustrate techniques that may be used to minimize the number of ports in the memories and solve memory conflicts. Other variations of these techniques, or combinations of the three architectures should become apparent from the following descriptions of these techniques.

FIG. 9A shows an iterative decoder architecture in accordance with one embodiment of the present disclosure. Iterative decoder 900 is conceptually similar to iterative decoder 400 in FIG. 4, but includes additional functionality directed to addressing the number of memory ports and the memory conflicts.

Similar to iterative decoder 400 of FIG. 4, iterative decoder 900 includes a channel detector 902 and an ECC decoder 904. ECC decoder 904 reads from and writes to APP memory 918 which stores a posteriori information of symbols in the received codeword, as is described in relation to FIG. 4. ECC decoder 904 may access APP memory 918 in every clock cycle to read a posteriori information for symbols to be processed by the ECC decoder (i.e., a priori information from the perspective of the processing about to start) and to write updated a posteriori information for symbols already processed by the ECC decoder. ECC decoder 904 generally accesses APP memory more frequently than channel detector 902, because one iteration of the ECC decoder typically encompasses multiple passes through all symbols in the codeword. For example, in one iteration, ECC decoder may process each symbol of the codeword five or more times, whereas channel detector 902 typically processes each symbol in the codeword only once.

Channel detector 902 performs its processing based on channel detector a priori information 936 which is obtained by subtracting the value of the channel detector extrinsic information, stored in channel detector extrinsic information memory 910, from the value of the a posteriori probabilities stored in APP memory 918 (subject to deinterleaving by deinterleaver 911). After a processing delay of $D_c$ time units (e.g., $D_c$ clock cycles) channel detector 902 obtains channel detector a posteriori information 903. The channel detector a priori information, which served as the input to the channel detector is subtracted from the output signal to yield the channel detector's extrinsic information 926. In hardware implementations, the subtraction may be based on delaying the channel detector a priori information by $D_c$ time units, i.e., the time needed by channel detector 902 to process the signal. The channel detector extrinsic information 926 may be stored in channel detector extrinsic information memory 910.

In addition to updating the channel detector extrinsic information memory 910 based on the channel detector a posteriori information, APP memory 918 is also updated. For example, the difference between the updated value of the channel detector extrinsic information 926 and the previous value of the channel detector extrinsic information 934, corresponding to the same symbol in the codeword, may be computed to obtain differential extrinsic information 928 (subject to interleaving by interleaver 910). The differential extrinsic information 928 may be added to the previous a posteriori information stored in APP memory 918 delayed by $D_c$ times units. The delay is required to ensure that the differential extrinsic information 928 is added to the same value that was used by channel detector 902 for computing extrinsic information 926, $D_c$ time units earlier.

In a naïve implementation, this process requires a four-port APP memory as there are two possible read operations (one requested by ECC decoder 904, the other by channel detector 902) and two possible write operations (one requested by ECC decoder 904, the other by channel detector 902) at any clock cycle during decoder processing. Minimizing the number of ports may result in considerable savings in the size and cost of the memories.

In some time instances, memory conflicts may also occur. For example, it may occur that ECC decoder 904 updates the value of the a posteriori information in APP memory 918 while the channel detector concurrently processes the same symbol of the codeword. In this case, the delayed a posteriori probabilities 930 may be outdated because of the update to the APP memory by ECC decoder 904. The minimization of the number of ports and the memory conflict may be addressed in several ways, as is discussed below.

In one embodiment, a protocol may be utilized to allow ECC decoder 904 to use two ports of the APP memory and ensure that the channel detector 902 uses only one additional port of the APP memory. This may be achieved by managing the read and write operations of the channel detector so that a posteriori information 929 is written in a time interval that is different from the time interval when a posteriori information 909 is read. This protocol requires a three-port APP memory and is feasible because the number of read operations and write operations performed by the channel detector is far smaller than the number of read operations and write operations performed by the ECC decoder. For example, in a given iteration, ECC decoder 904 may process each symbol of the codeword five or more times, whereas channel detector 902 typically processes each symbol in the codeword only once.

In a related embodiment of the present disclosure, the memory conflict may be addressed by reading the updated a posteriori information from APP memory 918 prior to performing addition 914 and updating the APP memory with the differential extrinsic information 928 of channel detector 902. In practical implementations, this read operation may need to be performed in addition to the read and write operations performed by ECC decoder 904 and the regular read and write operations performed by channel detector 902. Given that memory conflicts occur rarely, the protocol can add extra scheduling steps to guarantee that the occasional additional read operation is scheduled together with the regular read and write operations of the three-port APP memory. From an implementation perspective, it may be possible to perform the occasional additional read operation since the memory possesses a sufficient number of ports and the number of regular read and write operations performed by the channel detector is far smaller than the number of reads and writes by the ECC decoder.

As mentioned earlier, the size and cost of a memory generally increases with the number of its ports. Therefore, from an implementation perspective, it is highly desirable that APP memory 918 need only support two ports, instead of three.

FIG. 9B shows an implementation architecture 940 of an iterative decoder that reduces the number of APP memory ports to only two ports, in accordance with an embodiment of the present disclosure. Implementation architecture 940 is similar to implementation architecture 900 except for including two additional buffers, a differential extrinsic information buffer 942 and an APP buffer 944.

Similar to implementation architecture 900, ECC decoder 904 performs read and write access of APP memory 918 in most clock cycles. However, during time periods in which a memory conflict would occur in implementation architecture 900, ECC decoder 904 is "stalled" and refrains from accessing APP memory 918 in either read or write operation. For example, during these time periods ECC decoder 904 may not perform any processing. The stalling of ECC decoder 904 enables channel detector 902 to perform read and write operation during these time periods.

In some embodiments, the frequency of reading from and writing to APP memory 918 is smaller for channel detector 902 compared to ECC decoder 904. The architecture 940 is particularly suitable in embodiments where, in one iteration, ECC decoder may process each symbol of the codeword many times, whereas channel detector 902 typically processes each symbol in the codeword only once; here, the read and write operations needed by the channel detector are relatively infrequent, thereby making the cost associated with stalling ECC decoder 904 small. Nonetheless, it is desirable that channel detector 902 utilizes the APP memory 918 as efficiently as possible during these time periods. This means that channel detector 902 should utilize APP memory 918 in as many clock cycles as possible. Moreover, when the ECC decoder 904 is stalled channel detector 902 should perform concurrent read and write operation during these clock cycles in order to utilize both ports of the memory as efficiently as possible.

Differential extrinsic information buffer 942 and APP buffer 944 may facilitate the efficient access of APP memory 918 by channel detector 902. Through buffering the information that is to be read from or to be written to the APP memory, the access of APP memory 918 can be performed more efficiently. Generally, the size of the additional buffers is smaller than the size of the APP memory 918, thus reducing the cost associated with the additional buffers.

In some embodiments, a type of memory conflict occurs when channel detector 902 modifies a memory location in APP memory 918 after ECC decoder 904 read from the memory location but before ECC decoder wrote its update to said memory location. In principle, the techniques discussed in the preceding paragraphs may be applied to this type of memory conflict in an analogous manner. For example, channel detector 902 may be stalled for a short period of time to enable ECC decoder 904 to read the latest content of the APP memory. Although this comes at the cost of stalling the operation of the channel decoder, this option may be adequate, because this type of memory conflict occurs only rarely. The relative rarity of this type of memory conflict results from the fact that the channel detector typically processes symbols more slowly than the ECC decoder (e.g., by a factor of five times or more). Therefore, assuming that a suitable protocol is employed, it is unlikely that the channel detector processes a given symbol while the ECC decoder has begun but not completed processing of the same symbol.

FIG. 9C shows an implementation architecture 960 of an iterative decoder that reduces the required number of APP memory ports to only two ports, in accordance with an embodiment of the present disclosure. Implementation architecture 960 is similar to implementation architecture 940 and likewise contains a differential extrinsic information buffer 942 and an APP buffer 944. However, in contrast to implementation architecture 940, implementation architecture 960 avoids stalling ECC decoder 904.

As previously described, additional memory ports would be required, if the read and write operations needed by channel detector 902 were allowed to access the APP memory at arbitrary time instances (e.g., arbitrary clock cycles). In the embodiment of FIG. 9C, the read and write operation issue may be resolved by buffering only a necessary amount of retrieved a posteriori information for channel detector processing and delaying the updating/writing of the information in APP memory 918 until the time when ECC decoder 904 performs its next update.

For example, given that the ECC decoder 904 may process each symbol of the codeword many times in one iteration, whereas channel detector 902 typically processes each symbol in the codeword only once per iteration, the a posteriori information that ECC decoder 904 writes into APP memory 918 may selectively be written into the APP buffer 944. The information that is written into the APP buffer 944 corresponds to symbols that will be needed by channel detector 902 in the near future. The rest of the a posteriori information that is written into APP memory 918 need not be written into the APP buffer at that time, because the channel detector processes a posteriori information in a much slower fashion. As a result, the need for the direct read operation from APP memory 918, with the purpose of updating channel detector 902, is removed.

In some embodiments, write operations associated with the APP memory may be resolved by delaying the channel detector write operation corresponding to the information in APP memory 918 until the time when ECC decoder 904 performs its next update. This requires buffering of the differential extrinsic information until ECC decoder 904 reaches the same symbol to be updated. However, such buffering is generally fairly small, because ECC decoder 904 generally processes each symbol in the received codeword multiple times (e.g., five times or more) during an iteration. Therefore, the worst-case buffer size amounts to only a fraction of the size of the codeword (e.g., only a fifth in case that the ECC decoder processes each symbol five times per iteration).

In some embodiments, such as architecture 940, memory conflicts may occur when the ECC decoder 904 is required to write updated information corresponding to a symbol into APP memory 918, but the information corresponding to this symbol in the APP memory has since been updated by channel decoder 902. This conflict may be resolved in architecture 960 by the already described buffering of differential extrinsic information in buffer 942 and the delaying of the write operation until the same symbol is accessed and processed by ECC decoder 904.

When ECC decoder 904 reaches a symbol location in APP memory 918 for which the channel decoder 902 has updated extrinsic information, an addition of the differential extrinsic information 962 and updated a posteriori information of the ECC encoder is performed and written to APP memory 918 at the same time. Performing the addition prior to writing to APP memory 918 obviates the need for a separate memory access by channel decoder 902 and thus revolves the necessity for the additional write operation. At the same time the memory conflict described in the previous paragraph is resolved.

At time periods when there is no available update in the buffer 942 from the channel detector on the particular processed symbol and no memory conflict, ECC decoder 904 reads and writes from APP memory without the need to add any differential extrinsic information, similar to the way ECC decoder 904 accesses APP memory 918 in implementation architecture 900 and 940.

Implementation architecture 960 essentially minimizes the number of required memory ports and solves the memory conflict by linking the access of APP memory 918 to the memory access timeline of ECC decoder 904. The channel detector 902 does not autonomously access APP memory 918 but performs updates only when ECC decoder 904 also updates information. Implementation architecture 960 may further benefit from the simple structure of interleaver 928 that supports efficient mapping of a channel detector symbol address to an ECC decoder symbol address.

The memory conflicts described in previous paragraphs were addressed by architectures 900, 940 and 960 in several ways. While these are suitable ways to resolve the memory conflicts, there may be several other possible ways in these architectures and related implementations. For example, a simple way to resolve memory conflicts is to select whether the channel detector or the ECC decoder has priority to write to the APP memory when a conflict is detected. If the ECC decoder is given priority, whenever a conflict situation occurs, the ECC decoder is allowed to write to the APP memory and the updated differential extrinsic information from the channel detector may be ignored. If the conflicts are rare, this may have a minor effect on the overall performance and quality of the iterative decoder.

Figure 10:
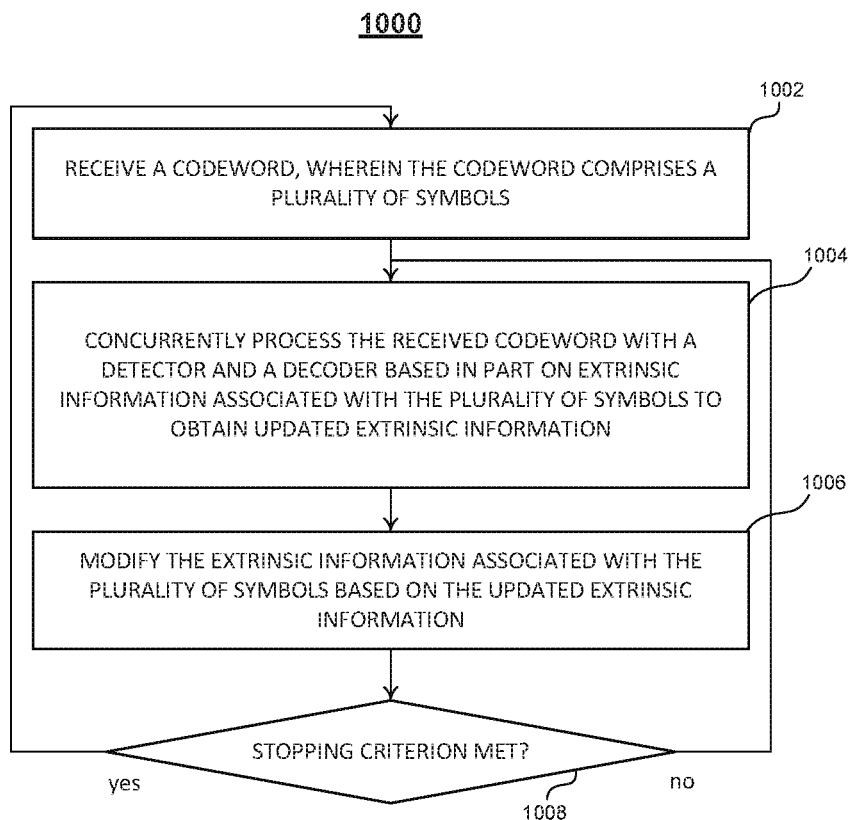
FIG. 10 shows a high-level flow chart of an iterative decoding process comprising concurrent processing of a received codeword by a channel detector and an ECC decoder, in accordance with an embodiment of the present disclosure.

FIG. 10 is a high-level flow chart of a process 1000 for decoding a codeword using an iterative decoding process in accordance with an embodiment of the present disclosure. Iterative decoder 116 may execute process 1000 by receiving a codeword comprising a plurality of symbols (1002). Process 1000 further includes, at 1004, concurrently processing the received codeword with a detector and a decoder based in part on extrinsic information associated with the plurality of symbols to obtain updated extrinsic information and, at 1006, modifying the extrinsic information associated with the plurality of symbols based on the updated extrinsic information. Process 1000 further includes repeating the processing at 1004 and the modifying at 1006 until a stopping criterion is met (1008). If the stopping criterion is met, a next codeword may be received and process 1000 may start again at 1002. On the other hand, if the stopping criterion is not met, the processing at 1004 and the modifying at 1006 may be repeated for the same codeword.

At 1002, a codeword, comprising a plurality of symbols, is received by iterative decoder 200. Upon reception, iterative decoder 400 may perform various initialization tasks, including but not limited to demodulating the received symbols to facilitate the iterative decoding operation, as is described in relation to FIG. 1. The received symbols are then passed on to iterative decoder 400.

At 1004, iterative decoder 400 may concurrently process the received codeword with a detector and a decoder based in part on extrinsic information associated with the plurality of symbols to obtain updated extrinsic information. The concurrent processing at 1004 may be performed by iterative decoder 400, comprising a channel detector 402 and an ECC decoder 404. Implementation architectures described in relation to FIGS. 9A, 9B, and 9C may be used. The extrinsic information associated with the plurality of symbols may be exchanged based on shared memory structures, such as based on APP memory 420 and extrinsic information memory 430, as described in relation to FIG. 4.

At 1006, process 1000 modifies the extrinsic information associated with the plurality of symbols based on the updated extrinsic information obtained at 1004. For example, both channel detector 402 and ECC decoder 404 may update a shared memory with the updated extrinsic information obtained from their respective processing. Storing the updated information in a shared memory allows the ECC decoder to make use of the latest extrinsic information processed by the channel detector and vice versa.

At 1008, process 1000 tests whether a stopping criterion is satisfied. For example, if process 1000 determines that decoding has been achieved with a sufficient degree of accuracy, iterative decoder may stop processing the received codeword and start processing a subsequent codeword, for example. The stopping criterion may be defined in different ways. In some embodiments, the stopping criterion may correspond to counting the number of iterations that have been performed for the codeword and terminating the decoding process after a predefined number of such iterations have been completed. Alternatively, or additionally, the stopping criterion may be based on an output of the channel detector or the ECC decoder. For example, if either the channel detector or the ECC decoder determines that the codeword has been decoded with sufficient reliability, the decoding process may be terminated.

If process 1000 determines that the stopping criterion has not been met, then process 1000 may resume at 1004 by repeating the concurrent processing of the received codeword with a detector and a decoder.

Figure 11:
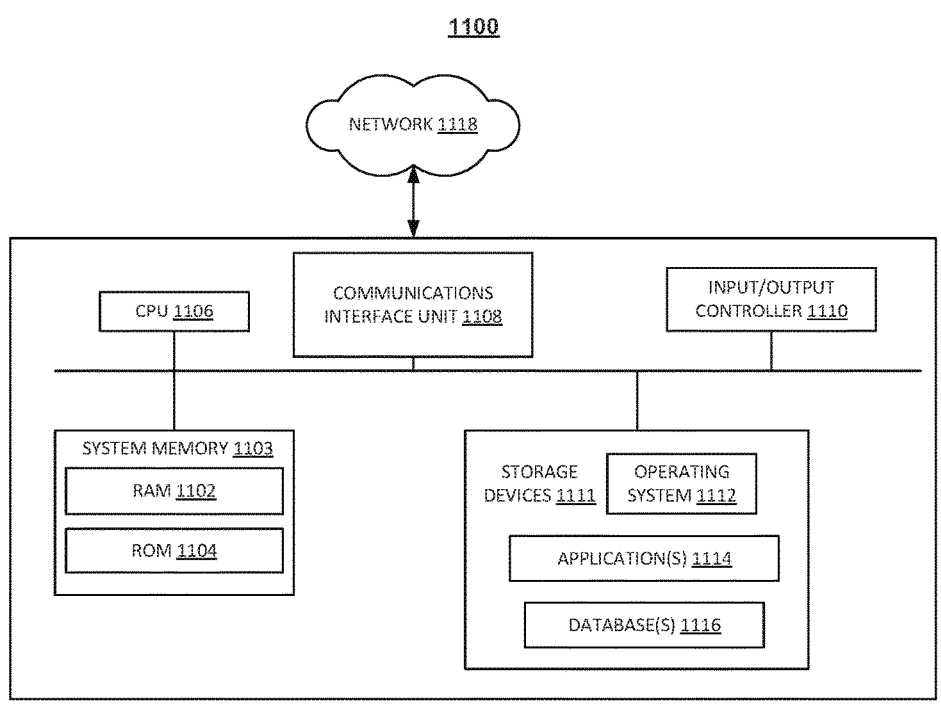
FIG. 11 shows a block diagram of a computing device, for performing any of the processes described herein, in accordance with an embodiment of the present disclosure.

FIG. 11 is a block diagram 1100 of a computing device, such as any of the components of the system of FIG. 4, for performing any of the processes described herein, in accordance with an embodiment of the disclosure. Each of the components of these systems may be implemented on one or more computing devices 1100. In certain aspects, a plurality of the components of these systems may be included within one computing device 1100. In certain embodiments, a component and a storage device 1111 may be implemented across several computing devices 1100.

The computing device 1100 comprises at least one communications interface unit 1108, an input/output controller 1110, system memory 1103, and one or more data storage devices 1111. The system memory 1103 includes at least one random access memory (RAM 1102) and at least one read-only memory (ROM 1104). All of these elements are in communication with a central processing unit (CPU 1106) to facilitate the operation of the computing device 1100. The computing device 1100 may be configured in many different ways. For example, the computing device 1100 may be a conventional standalone computer or alternatively, the functions of computing device 1100 may be distributed across multiple computer systems and architectures. In FIG. 11, the computing device 1100 is linked, via network 1118 or local network, to other servers or systems.

The computing device 1100 may be configured in a distributed architecture, wherein databases and processors are housed in separate units or locations. Some units perform primary processing functions and contain at a minimum a general controller or a processor and a system memory 1103.

In distributed architecture embodiments, each of these units may be attached via the communications interface unit 1108 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 1106 comprises a processor, such as one or more conventional microprocessors and one or more supplementary co-processors such as math co-processors for offloading workload from the CPU 1106. The CPU 1106 is in communication with the communications interface unit 1108 and the input/output controller 1110, through which the CPU 1106 communicates with other devices such as other servers, user terminals, or devices. The communications interface unit 1108 and the input/output controller 1110 may include multiple communication channels for simultaneous communication with, for example, other processors, servers or client terminals.

The CPU 1106 is also in communication with the data storage device 1111. The data storage device 1111 may comprise an appropriate combination of magnetic, optical or semiconductor memory, and may include, for example, RAM 1102, ROM 1104, flash drive, an optical disc such as a compact disc or a hard disk or drive. The CPU 1106 and the data storage device 1111 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 1106 may be connected to the data storage device 1111 via the communications interface unit 1108. The CPU 1106 may be configured to perform one or more particular processing functions.

The data storage device 1111 may store, for example, (i) an operating system 1112 for the computing device 1100; (ii) one or more applications 1114 (e.g., computer program code or a computer program product) adapted to direct the CPU 1106 in accordance with the systems and methods described here, and particularly in accordance with the processes described in detail with regard to the CPU 1106; or (iii) database(s) 1116 adapted to store information that may be utilized to store information required by the program.

The operating system 1112 and applications 1114 may be stored, for example, in a compressed, an uncompiled and an encrypted format, and may include computer program code. The instructions of the program may be read into a main memory of the processor from a computer-readable medium other than the data storage device 1111, such as from the ROM 1104 or from the RAM 1102. While execution of sequences of instructions in the program causes the CPU 1106 to perform the process steps described herein, hardwired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to synchronization signal acquisition as described herein. The program also may include program elements such as an operating system 1112, a database management system and "device drivers" that allow the processor to interface with computer peripheral devices (e.g., a video display, a keyboard, a computer mouse, etc.) via the input/output controller 1110.

The term "computer-readable medium" as used herein refers to any non-transitory medium that provides or participates in providing instructions to the processor of the computing device 1100 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer readable media may be involved in carrying one or more sequences of one or more instructions to the CPU 1106 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 1100 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only be the claims which follow.

What is claimed is:

1. A method for processing a first codeword having a plurality of symbols, the method comprising:
   receiving the first codeword;

processing the first codeword with a detector to generate extrinsic information;
concurrently processing the first codeword with a decoder to generate updated extrinsic information, wherein the detector and the decoder process different symbols of the first codeword in parallel;
predicting, based on the updated extrinsic information, that the decoder is about to reach convergence;
in response to predicting that the decoder is about to reach convergence, causing the detector to process a second codeword while the decoder continues to process the first codeword; and
in response to predicting that the decoder is not about to reach convergence, repeating the processing by the detector and by the decoder.

2. The method of claim 1, wherein the extrinsic information is stored in a common memory location that is accessed on-demand by the detector and the decoder.

3. The method of claim 1 further comprising:
scheduling the processing performed by the detector and the decoder such that the detector and the decoder access extrinsic information corresponding to the different symbols.

4. The method of claim 3, wherein the scheduling further comprises:
determining that the detector and the decoder are about to access extrinsic information corresponding to a given symbol; and
in response to the determining, idling the decoder while the detector processes the given symbol.

5. The method of claim 3, wherein the scheduling further comprises:
determining that the detector and the decoder are about to access extrinsic information corresponding to a given symbol; and
in response to the determining, buffering the updated extrinsic information of the detector.

6. The method of claim 3, wherein the scheduling further comprises:
determining that the detector and the decoder are about to access extrinsic information corresponding to a given symbol; and
in response to the determining, giving priority to one of the detector and the decoder.

7. The method of claim 1, wherein the detector is a channel detector and the decoder is an error correction control (ECC) decoder.

8. The method of claim 1, wherein the processing performed by at least one of the detector and the decoder differs between a first iteration and a second iteration.

9. The method of claim 1, wherein the processing performed by the detector is based on a soft-output Viterbi algorithm and the processing performed by the decoder is based on a low-density parity check (LDPC) decoding algorithm.

10. The method of claim 1, wherein:
the decoder is a low-density parity check (LDPC) decoder; and
predicting that the decoder is about to reach convergence comprises verifying that a syndrome weight in the decoder is below a pre-determined threshold.

11. A system for processing a first codeword having a plurality of symbols, the system comprising:
a detector configured to process the first codeword to generate extrinsic information;
a decoder configured to concurrently process the first codeword to generate updated extrinsic information, wherein the detector and the decoder are configured to process different symbols of the first codeword in parallel; and
control circuitry configured to:
receive the first codeword;
predict, based on the updated extrinsic information, that the decoder is about to reach convergence;
in response to predicting that the decoder is about to reach convergence, cause the detector to process a second codeword while the decoder continues to process the first codeword; and
in response to predicting that the decoder is not about to reach convergence, repeat the processing by the detector and by the decoder.

12. The system of claim 11 further comprising:
a memory configured to store the extrinsic information, wherein the extrinsic information is accessed on-demand by the detector and the decoder.

13. The system of claim 11, wherein the control circuitry is further configured to:
schedule the processing performed by the detector and the decoder such that the detector and the decoder access extrinsic information corresponding to the different symbols.

14. The system of claim 13, wherein the control circuitry is further configured to:
determine that the detector and the decoder are about to access extrinsic information corresponding to a given symbol; and
in response to the determining, idle the decoder while the detector processes the given symbol.

15. The system of claim 13, wherein the control circuitry is further configured to:
determine that the detector and the decoder are about to access extrinsic information corresponding to a given symbol; and
in response to the determining, buffer the updated extrinsic information of the detector.

16. The system of claim 13, wherein the control circuitry is further configured to:
determine that the detector and the decoder are about to access extrinsic information corresponding to a given symbol; and
in response to the determining, give priority to one of the detector and the decoder.

17. The system of claim 11, wherein the detector is a channel detector and the decoder is an error correction control (ECC) decoder.

18. The system of claim 11, wherein the processing performed by at least one of the detector and the decoder differs between a first iteration and a second iteration.

19. The system of claim 11, the detector is configured to process the codeword based on a soft-output Viterbi algorithm, and the decoder is configured to process the codeword based on a low-density parity check (LDPC) algorithm.

20. The system of claim 11, wherein:
the decoder is a low-density parity check (LDPC) decoder; and
the control circuitry configured to predict that the decoder is about to reach convergence is further configured to verify that a syndrome weight in the decoder is below a pre-determined threshold.

* * * * *